United States Patent [19]

Massini, Jr. et al.

[11] Patent Number: 5,538,175
[45] Date of Patent: * Jul. 23, 1996

[54] ADJUSTMENT OF A SOLDER WAVE PROCESS IN REAL-TIME

[75] Inventors: Anthony L. Massini, Jr., Palm Harbor; Roy D. Shepard, Largo, both of Fla.

[73] Assignee: AT&T Corp., Murray Hill, N.J.

[*] Notice: The portion of the term of this patent subsequent to Nov. 21, 2014, has been disclaimed.

[21] Appl. No.: 342,562

[22] Filed: Nov. 21, 1994

[51] Int. Cl.$^6$ ................................ H05K 3/34; B23K 3/06
[52] U.S. Cl. ........................... 228/102; 228/37; 228/11
[58] Field of Search .......................... 228/102, 11, 9, 228/37, 103, 56.5

[56] References Cited

U.S. PATENT DOCUMENTS

| | | | |
|---|---|---|---|
| 4,180,199 | 12/1979 | O'Rourke et al. | 228/102 |
| 4,632,291 | 12/1986 | Rahn et al. | 228/9 |
| 5,023,848 | 6/1991 | Frey et al. | 368/1 |
| 5,388,468 | 2/1995 | Sasson | 228/56.5 |

FOREIGN PATENT DOCUMENTS

| | | | |
|---|---|---|---|
| 0269822 | 6/1988 | European Pat. Off. | 228/37 |
| 62-267065 | 11/1987 | Japan | 228/103 |
| 63-220973 | 9/1988 | Japan | 228/37 |
| 1-104465 | 4/1989 | Japan | 228/11 |

OTHER PUBLICATIONS

Excerpt from a manual on a Sensbey Soldering Machine (Jan. 1990).

*Primary Examiner*—P. Austin Bradley
*Assistant Examiner*—Jeffrey T. Knapp
*Attorney, Agent, or Firm*—Joseph J. Opalach

[57] ABSTRACT

In a wave solder manufacturing process, a test device is used to measure the contact-area between a solder wave and a printed wiring board. In particular, the test device is a printed wiring board (PWB) that includes at least two arrays of electrical contacts, one array near each side of the PWB. As the PWB makes contact with a solder wave, the number of electrical contacts in each array that are grounded by the solder wave are counted and displayed on an alpha-numeric display mounted on top of the PWB. This "distance-based" measurement provides an accurate determination of the uniformity of the contact-area, and concomitantly the dwell-time of the soldering process. This test device provides a basis for real-time adjustment of solder wave height, and end-to-end balance, in a solder wave machine. In particular a wave solder machine includes a means for receiving contact-area information from the test device and a means for adjusting the solder wave in response to the contact-area information.

17 Claims, 11 Drawing Sheets

FIG. 14

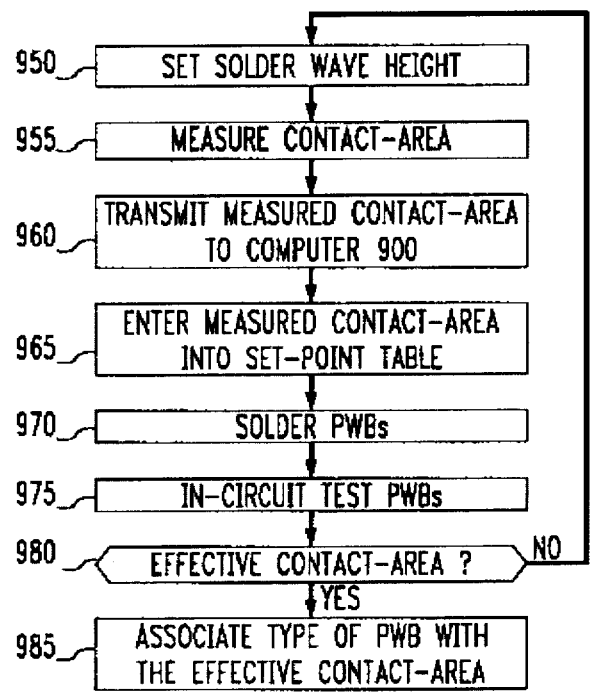

950 — SET SOLDER WAVE HEIGHT
955 — MEASURE CONTACT-AREA
960 — TRANSMIT MEASURED CONTACT-AREA TO COMPUTER 900
965 — ENTER MEASURED CONTACT-AREA INTO SET-POINT TABLE
970 — SOLDER PWBs
975 — IN-CIRCUIT TEST PWBs
980 — EFFECTIVE CONTACT-AREA ?  NO
↓ YES
985 — ASSOCIATE TYPE OF PWB WITH THE EFFECTIVE CONTACT-AREA

FIG. 15

SET-POINT TABLE 940

| CONTACT-AREA | COARSE | FINE |
|---|---|---|
| $X_0$-$Y_0$ | $C_0$ | $F_0$ |
| $X_1$-$Y_1$ | $C_1$ | $F_1$ |
| ⋮ | ⋮ | ⋮ |

FIG. 16

PWB TABLE 945

| PWB TYPE | EFFECTIVE CONTACT-AREA |
|---|---|
| A | $X_1$-$Y_1$ |
| B | $X_0$-$Y_0$ |
| ⋮ | ⋮ |

ADJUSTMENT OF A SOLDER WAVE PROCESS IN REAL-TIME

CROSS-REFERENCE TO RELATED APPLICATION

Related subject matter is disclosed in the co-pending, commonly assigned, U.S. patent application of Massini et al., entitled "Solder Wave Measurement Device," Ser. No. 08/343,561, filed on Nov. 21, 1994.

BACKGROUND OF THE INVENTION

The present invention relates to manufacturing equipment and, more particularly, to wave solder machines.

Generally speaking, in a wave soldering machine a printed wiring board (PWB) is moved by conveyor on an inclined path past a fluxing station, a preheating station, and, finally, a station at which a wave of solder is caused to well upwardly and contact various portions of the PWB to be soldered. The efficiency of this wave soldering process is affected by a number of concerns, two of which are known in the an as the "contact-area" and the "dwell-time." The dwell-time represents the amount of time any given area of the PWB is in actual contact with the solder. Generally, the dwell-time is related to the contact-area and can be determined by simply dividing the length of the contact-area, which is in the direction of travel, by the speed of the conveyor belt.

The contact-area represents that portion of the PWB that is in actual contact with the solder wave, i.e., the area of the PWB that is currently covered by the solder wave. It is preferable to have a contact-area that is uniform, i.e., not uneven. A uniform contact-area is one where the dwell-time is the same for all portions of the PWB. For example, for a rectangular shape all portions of the PWB perpendicular to the direction of motion enter, and leave, the solder wave at approximately the same time. However, if the contact-area is not uniform, then some portions of the PWB are within the solder bath longer than other portions, i.e., the dwell-time changes across the PWB. For example, if the contact-area is trapezoidal (with the parallel sides in the direction of travel), one side of the PWB maintains contact with the solder longer than the opposite side. If the dwell-time is too short, the soldering process may not be completed. On the other hand if the dwell-time is too long, the PWB may become too soft and begin to sag, or solder may go up through the holes of the PWB due to strong capillary action, which could result in solder bridges forming on the component side of the board.

One method for measuring the solder wave contact-area and the dwell-time is to use a tempered glass plate that is passed over the solder wave during a "test pass." This glass plate has a set of grid lines of known dimensions. As the glass plate passes over the solder wave, the contact-area is visually observed, and approximately measured via the grid lines, by an operator of the solder wave machine. From the observed contact-area, the dwell-time is determined by dividing the length of the contact-area, i.e., that dimension in the direction of motion of the conveyor belt, by the speed of the conveyor belt.

Unfortunately, this method for measuring the contact-area is purely subjective and only yields an approximation of the contact-area. In addition, in order to observe the contact-area on the glass plate, the wave soldering machine conveyor speed must be slowed so that the operator has time to observe the glass plate.

Other methods known in the an address the determination of dwell-time but, overall, assume a uniform contact-area. For example, U.S. Pat. No. 5,023,848, issued Jun. 11, 1991 to Frey et al., addresses the problem of determining an accurate dwell-time in the presence of "drag-out." The latter effect is when solder tends to hang on to one lead, or leads, longer than other leads. In this approach, a test device includes two electrical contacts, each contact located at opposite ends of the test device. As the test device passes through a solder wave, the latter provides the electrical connectivity between this pair of electrical contacts. Eventually, the test device moves out of the solder wave, and the electrical connectivity between the pair of electrical contacts is broken. A timer measures the time duration of the electrical connectivity between the contacts. This time duration is used to represent the dwell time. Since only two electrical contacts are used, a uniform contact-area is presumed. Similarly, U.S. Pat. No. 4,180,199, issued Dec. 25, 1979 to O'Rourke et al., describes a system for measuring dwell-time and temperature profiles of a soldering operation. In particular, dwell-time is measured by the amount of time a single electrical contact is grounded by immersion in a solder bath. The use of a single electrical contact again presumes a uniform contact-area.

In that some solder wave machines provide for automatic adjustment of solder wave height presuming a uniform contact-area. For example, Model Number LGC400DR(JK) from the Sensbey Corporation adjusts the height of the solder wave by using a single probe that floats in the solder wave. Information from this single probe is then used to adjust the height of the solder wave, which, in turn, affects the size of the contact-area.

SUMMARY OF THE INVENTION

The co-pending, commonly assigned, U.S. patent application of Massini et.al., entitled "Solder Wave Measurement Device," Ser. No. 08/342,561, filed on Nov. 21, 1994 describes a test device that further improves the characterization of contact-area and, concomitantly, dwell-time during wave soldering. This test device has several linear arrays of electrical contacts for determining the solder wave contact-area.

However, we have also realized that such a test device provides a basis for real-time adjustment of solder wave height in a solder wave machine. In particular, and in accordance with the invention, a wave solder machine includes a means for receiving contact-area information from the test device and a means for adjusting the solder wave in response to the contact-area information.

BRIEF DESCRIPTION OF THE DRAWING

FIG. 14 is a flow diagram of an illustrative method for use in the embodiment of FIG. 11;

FIG. 15 is an illustrative set-point table;

FIG. 16 is an illustrative PWB table; and

DETAILED DESCRIPTION

Figure 1:
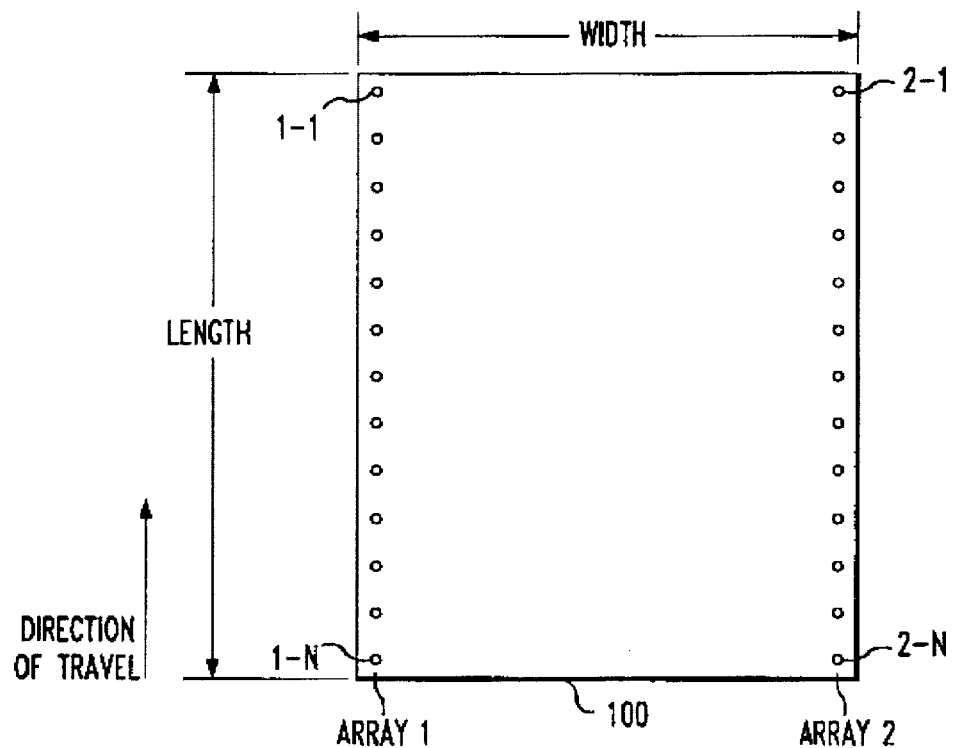
FIG. 1 shows an illustrative bottom-view of a test apparatus for measuring the contact-area of a solder wave.

FIG. 1 shows an illustrative bottom-view of test apparatus 100 for measuring the contact-area of a solder wave. Other than the inventive concept, the elements of test apparatus 100 (further listed below) are well-known and will not be described in detail. Test apparatus 100 is assumed to be a PWB that includes a plurality of arrays, herein represented as array 1 and array 2. Each array includes a number of electrical contacts along the length of the PWB. As used herein, the term "length" refers to that dimension of the PWB in the direction of travel along a conveyor belt of the solder wave machine (not shown), and the term "width" refers to that dimension of the PWB perpendicular to the direction of travel. It is assumed that the width of the solder wave is larger than the width of the PWB, which is typically the case. Array 1 and array 2 represent a two-dimensional matrix of electrical contacts. Array 1 includes electrical contacts 1-1 through 1-N. Similarly, array 2 includes electrical contacts 2-1 through 2-N. Each electrical contact is simply a plated-through hole (PTIt) as known in the art. As described further below, a solder wave (not shown) makes contact with the bottom of test apparatus 100 and consequently makes contact with a number of the PTHs of array 1 and array 2.

Figure 2:
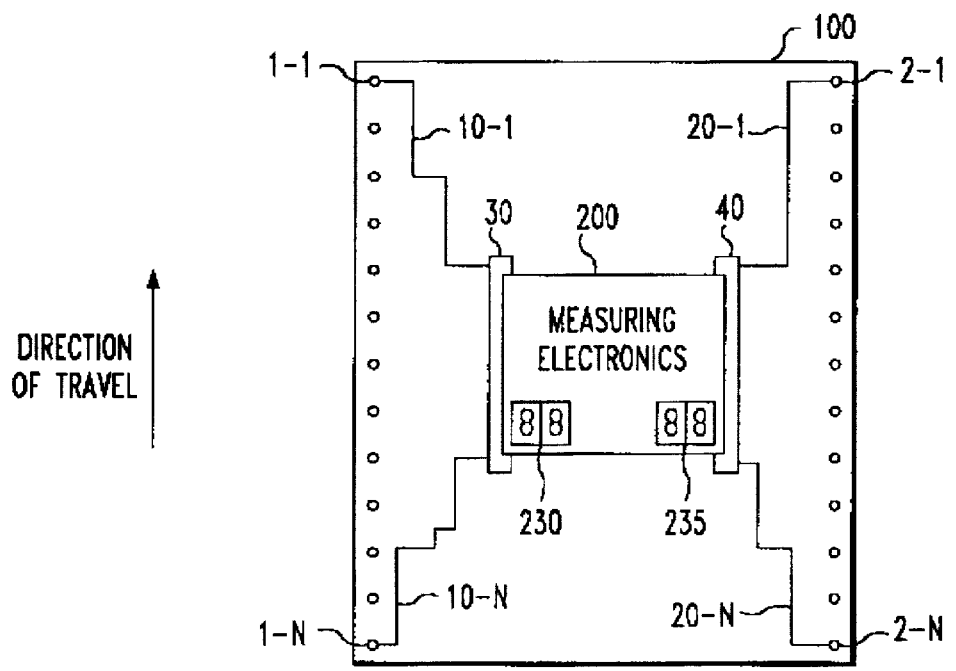
FIG. 2 shows an illustrative top-view of the test apparatus of FIG. 1.

FIG. 2 shows an illustrative top-view of test apparatus 100. On the top of test apparatus 100 are connectors 30 and 40 and measuring electronics 200. Each of the PTHs of array 1 is electrically coupled to connector 30 via corresponding electrical paths 10-1 through 10-N. Similarly, each of the PTHs of array 2 is electrically coupled to connector 40 via corresponding electrical paths 20-1 through 20-N. As can be seen from FIG. 2, measuring electronics 200 includes light-emitting diode displays 230 and 235. The latter display the number of PTI Is on each side of test apparatus 100 currently in contact with the solder wave. It is assumed that measuring electronics 200 plugs into connectors 30 and 40 as known in the art. It should be noted that both connectors 30 and 40 are assumed to be surface mounted, i.e., the mounting for these connectors is not through PTHs. Generally, the temperature on the top surface of test apparatus 100 is less than the temperature on the bottom surface of test apparatus 100 because of the insulating properties due to the fiber-glass construction of a typical PWB. However, if solder reflow is a problem, the solder used to construct test apparatus 100 can be a "higher temperature" solder than that normally used in the wave solder machine. A higher temperature solder is constructed by altering the percentage of tin and lead. For example, a solder comprising 95% lead and 5% tin changes the solder melting point to approximately 314° C. which is 50° F. higher than the typical solder set temperature of 250° C.

Figure 3:
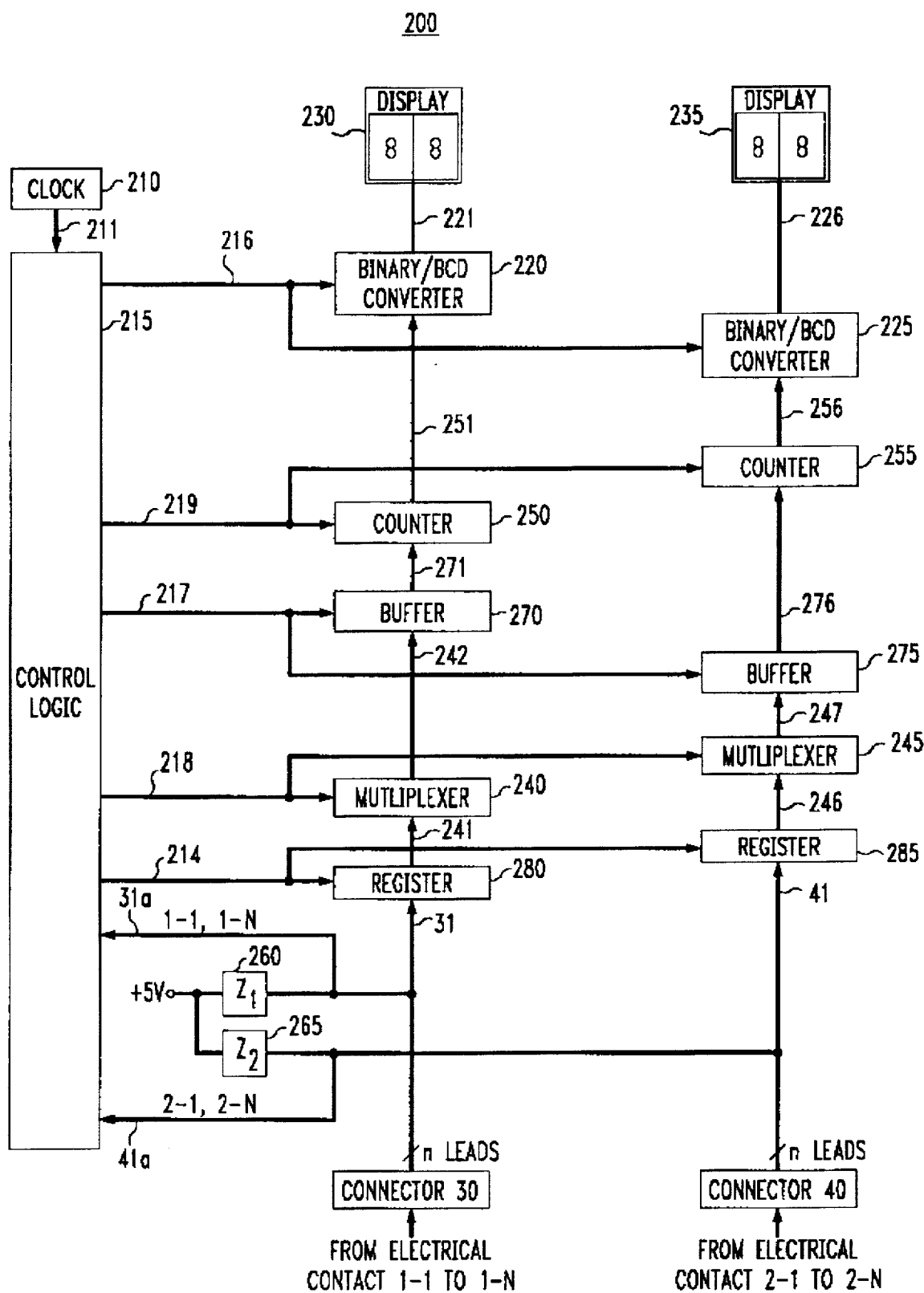
FIG. 3 is a block diagram of measuring electronics 200.

FIG. 3 shows an illustrative block diagram of measuring electronics 200. The latter includes clock circuitry (clock) 210, control logic 215, binary/binary-coded-decimal(BCD) converters 220 and 225, light-emitting diode displays (displays) 230 and 235, counters 250 and 255, buffers 270 and 275, registers 280 and 285, multiplexers 240 and 245, and impedance networks 260 and 265. Inclusions of a suitable battery as a power source is presumed and not shown. Clock 210 provides a number of clock signals via line 211. Unless otherwise noted, the use of a single line in FIG. 3 is merely representative of any number of electrical connections between the corresponding circuitry of measuring electronics 200. For example, line 211 represents a number of clock signals provided by clock 210 for use by control logic 215. The latter controls the measurement and display of the contact-area as described below. For simplicity, since the circuitry associated with array 2 is similar to the circuitry associated with array 1, only the latter circuitry will be described below.

Connector 30 electrically couples the electrical signals appearing on electrical contacts 1-1 through 1-N of array 1 to register 280 via line 31. As shown in FIG. 3, each electrical contact 1-1 through 1-N, is "pulled high" to, illustratively, ±5 Volts via impedance network 260. The latter is simply a plurality of resistors, where each resistor couples a corresponding electrical contact to ±5 Volts. As known in the art, a solder bath effectively provides an "electrical ground." Consequently, when each electrical contact is not in contact with the solder bath, the corresponding electrical signal is "pulled high" to 5 Volts and represents a logical "ONE." Conversely, as the solder wave contacts each electrical contact, the respective contact is grounded, i.e., "pulled low," to zero Volts and represents a logical "ZERO."

Register 280, under the direction of control logic 215 via line 214, periodically latches a representation of the binary values of the electrical signals appearing on electrical contacts 1-1 through 1-N, described further below. This sampling of array 1 is performed to remove any noise that is a result of intermittent contact between the solder and an electrical contact. The output of register 280 is a corresponding set of N signals provided to multiplexer 240 via line 241.

Multiplexer 240 is assumed to be a 1-of-N multiplexer as known in the art and, in addition to the set of N electrical signals provided by register 280, also receives a set of address signals via line 218 from control logic 215. The number of address signals is simply equal to $\log_2 N$. Multiplexer 240 uses the binary value of the address signals at any point in time to select one of the sampled N electrical contacts. The output signal of multiplexer 240 is a logical ONE when the sampled electrical contact is not touching the solder bath and a logical ZERO when the sampled electrical contact is touching the solder bath. This output signal is provided to buffer 270. As described further below, buffer 270 gates the output signal from multiplexer 240 so that a negative going pulse is provided to counter 250, via line 271, whenever the sampled electrical contact is in contact with the solder wave, i.e., at a logical ZERO. Counter 250 simply counts the number of negative going pulses from buffer 270. Binary/BCD converter 220 converts the count of counter 250 to a BCD number and drives corresponding display 230 to display the count, i.e., the number of electrical contacts currently in contact with the solder wave, which also represents a respective "contact-length" of the contact-area. Consequently, and in accordance with the inventive concept, displays 230 and 235, together provide an estimation of the contact-area of the solder wave. This number can be suitably cross-indexed via a table (not shown) that includes data listing the displayed contact-area versus conveyor speed to provide a respective dwell-time.

Figure 4:
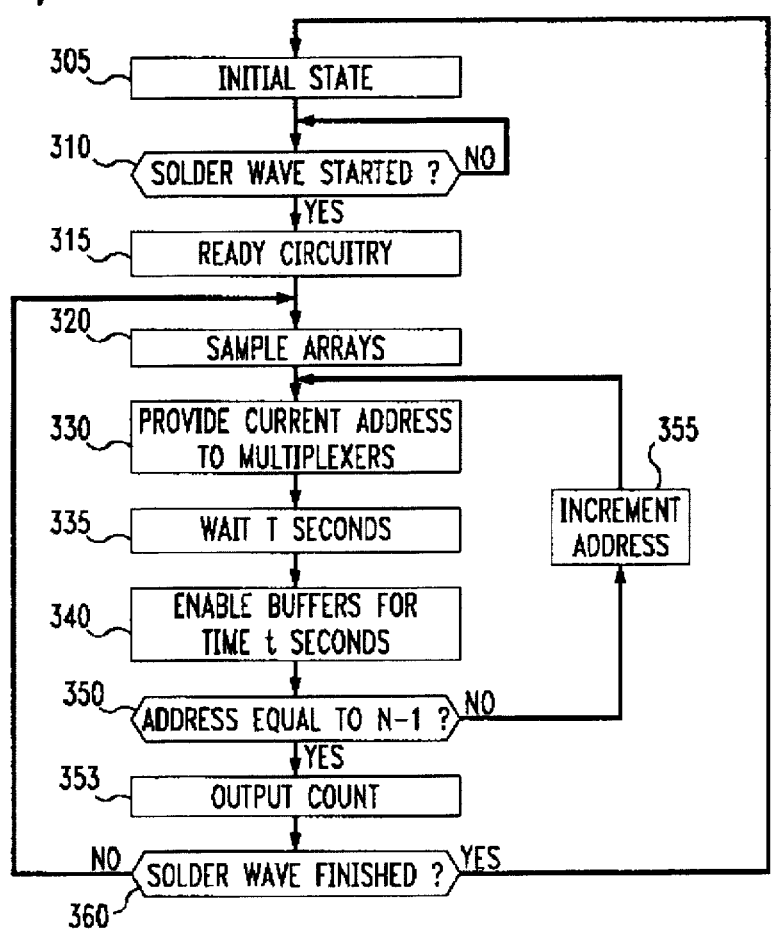
FIG. 4 is a flow diagram of an illustrative method for use in measuring electronics

As noted above, control logic 215 orchestrates the measuring of a contact-area. In particular, control logic 215 is a simple state machine that executes the method shown in FIG. 4. In step 305, control logic 215 begins in an initial state in which control logic 215 inhibits counters 250 and 255 from counting, and disables buffers 270 and 275. In this state, displays 230 and. 235 display the current BCD numbers provided by binary/BCD converters 220 and 225, respectively. After the initial state, control logic 215 goes to step 310 to determine if a solder wave process has started. As shown in FIG. 3, control logic 215 receives electrical contact signals 1-1 and 1-N via line 31a, and 2-1 and 2-N via line 41a. Also, referring back to FIGS. 1 and 2, it is assumed that the direction of travel on the conveyor belt (not shown) is such that either, or both, electrical contacts 1-1 and 2-1 initially make contact with the solder wave. In step 310, control logic 215 waits for a transition from a logical ONE to a logical ZERO by the signals from either of these contacts. If a logical ONE is detected, control logic 215 continues to wait for the start of a soldering process. However, if a logical ZERO is detected, control logic 215 begins the counting process. In step 315, control logic 215 clears and enables binary/BCD converters 230 and 235. As a result, displays 230 and 235 show a reading of "00." Similarly, control logic 215 clears counters 250 and 255 and disables buffers 270 and 275. It is assumed that in the disabled state, the output signals of buffers 270 and 275 conform to a logical ONE. Finally control logic 215 provides a zero address to multiplexers 240 and 245.

In step 320, control logic 215 latches the signals presents on the electrical contacts of both arrays into registers 280 and 285, via line 214. In step 330, control logic 215 provides the current address to multiplexers 240 and 245. At this point, the current address is 0. As a result, each multiplexer provides the corresponding sampled electrical signal on output lines 242 and 247, respectively. Control logic 215 then waits for T seconds in step 335 to wait for the multiplexer output signals to become stable. In step 340, control logic 215 enables buffers 270 and 275 for a time period t. As a result, if the output signal from a multiplexer is at a logical ZERO, the respective buffer will generate a negative-going pulse to the respective counter for the time t. In step 350, control logic 215 checks if the current address is equal to N–1. If not, the current address is incremented in step 355 and the process begins again at step 330. However, if the current address is equal to N–1, binary/BCD converters 220 and 225 latch the output of counters 250 and 255, respectively, in step 353 for viewing on corresponding displays 230 and 235. Control logic 215 checks if the soldering process is finished in step 360. Electrical contacts 1-N and 2-N will be the last electrical contacts to touch the solder wave. The transition by either, or both, o:f these respective signals from a logical ZERO to a logical ONE is used as a signal to control logic 215 to stop the counting process. If the solder process is not yet finished, control logic 215 returns to step 320 and again samples the electrical contacts of arrays 1 and 2, etc. However, if the solder processing is finished, control logic 215 returns to step 305.

The time between repeated execution of step 320 is defined herein as the sample time. i.e., the period of time between snapshots of each array. Illustratively, for a value of N equal to 64, the sample time is equal to 0.1 seconds, and both T and t are equal to 0.154 milli-seconds.

Figure 5:
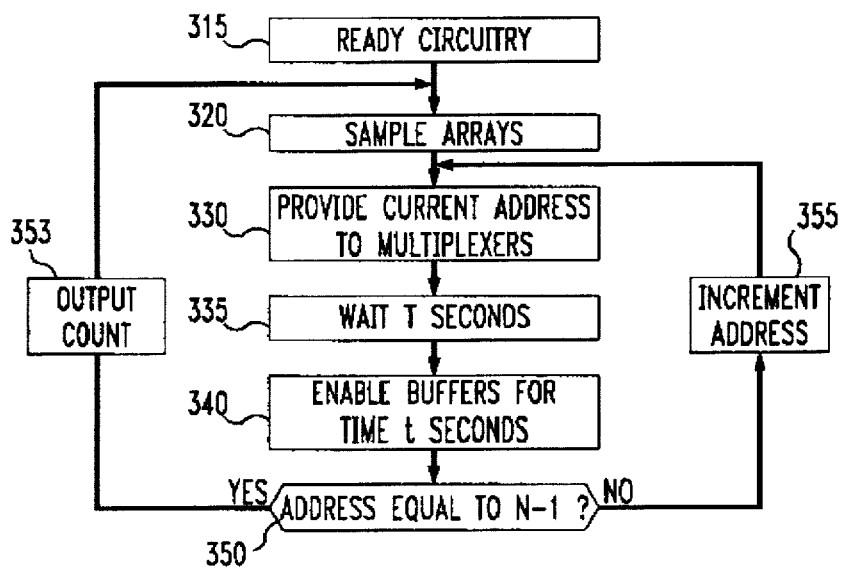
FIG. 5 is a flow diagram of another illustrative method for use in measuring electronics 200.
Figure 6A:
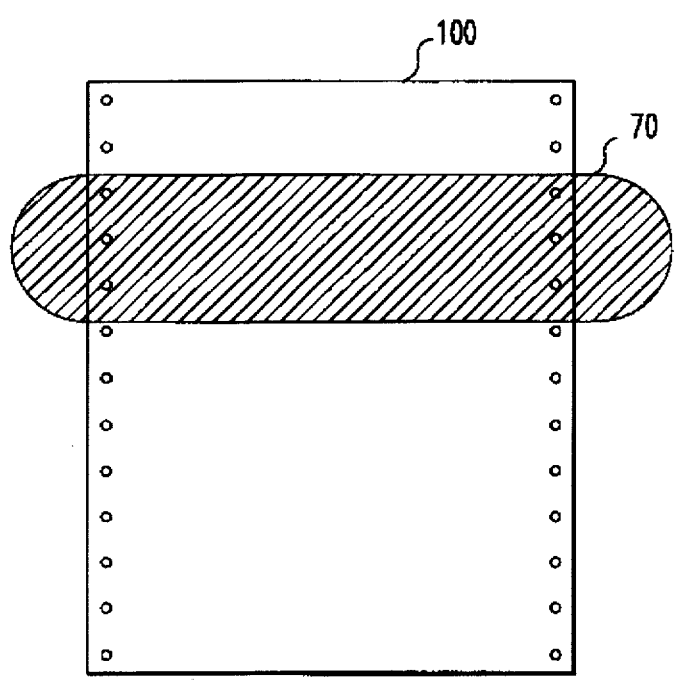
FIG. 6 illustrates a static method for measuring contact-area.
Figure 6B:
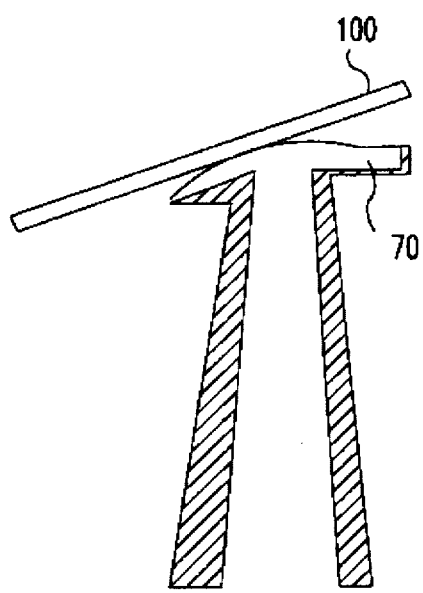
Figure 7:
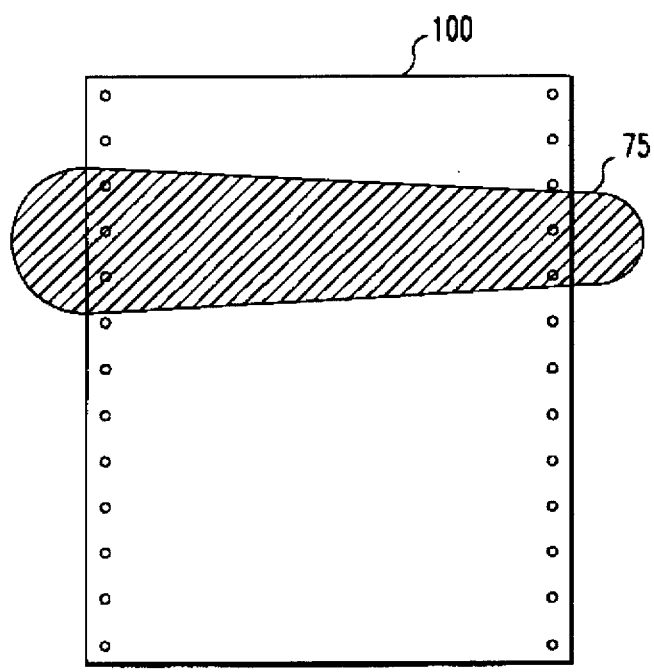
FIG. 7 illustrates an uneven solder wave.

In the above example, it is assumed that test apparatus 100 is placed on the conveyer of a solder wave machine (not shown) and moved over the solder wave. This allows control logic 215 to be triggered in step 310 when either the electrical contact 1-1 or 2-1 contact the solder wave. This method is termed the "dynamic method." An alternative method is the "static method." This method is shown in FIG. 5, which is similar to the method of FIG. 4 except that control logic 215 continuously counts and displays the number of electrical contacts in contact with the solder wave. In this method, control logic 215 begins in step 315 and when the address value is equal to N–1 returns to step 315 to start over. The static method is also illustrated in FIG. 6. In this method, test apparatus 100 is placed in a fixed position over solder wave 70. As known in the art, the solder wave is simply brought up and an operator visually inspects displays 230 and 235. As can be observed from FIG. 6, a uniform contact-area is shown, i.e., the number of electrical contacts in contact with solder wave 70 are equal. For comparison, an example of an uneven wave is shown in FIG. 7. An uneven wave can be corrected by appropriate adjustment of the guide rails typically found on a solder wave machine (not shown), or by adjustment of the solder wave form (not shown).

Figure 8:
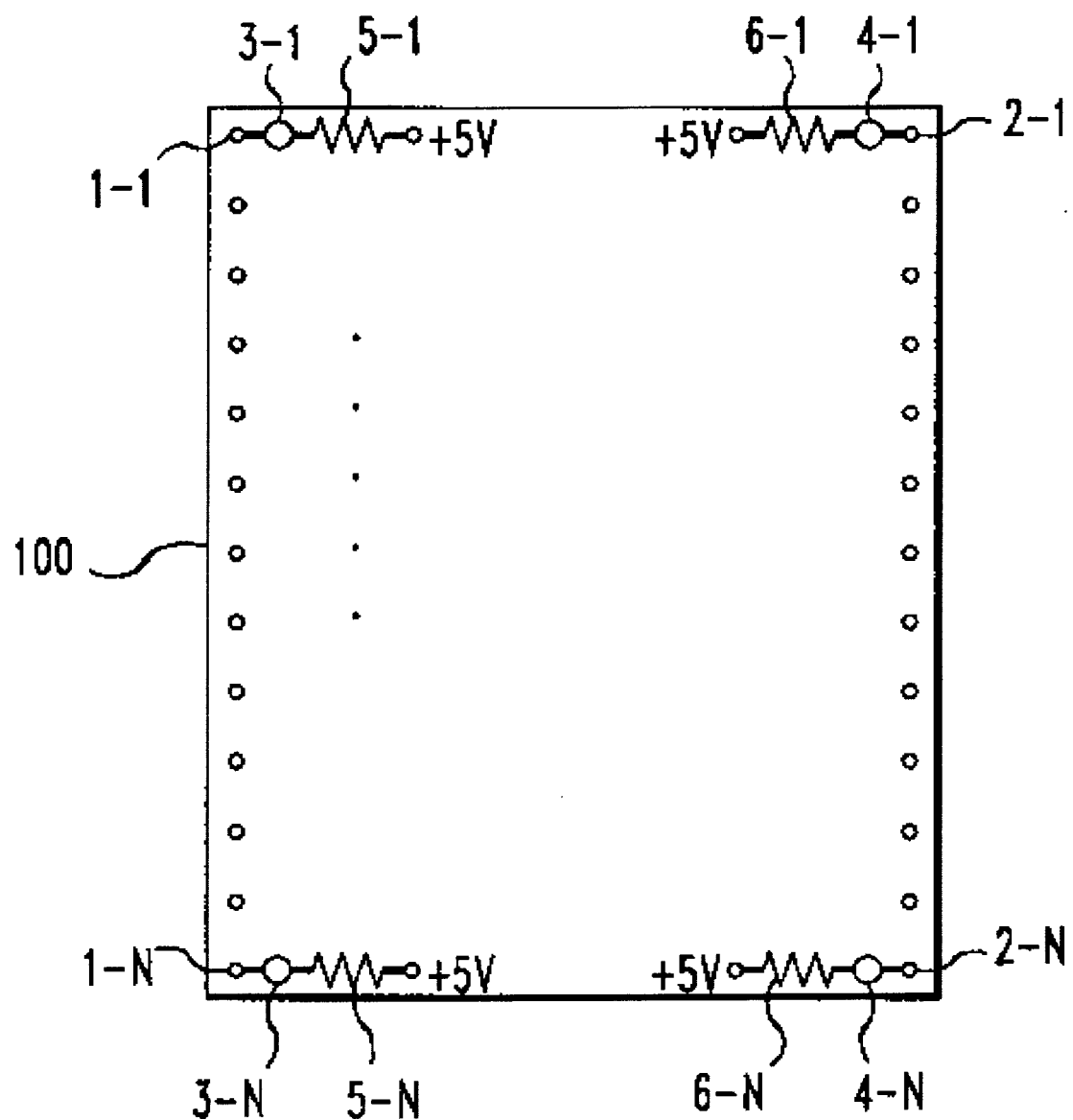
FIG. 8 shows an illustrative top-view of another test apparatus for measuring the contact-area of a solder wave.
Figure 9:
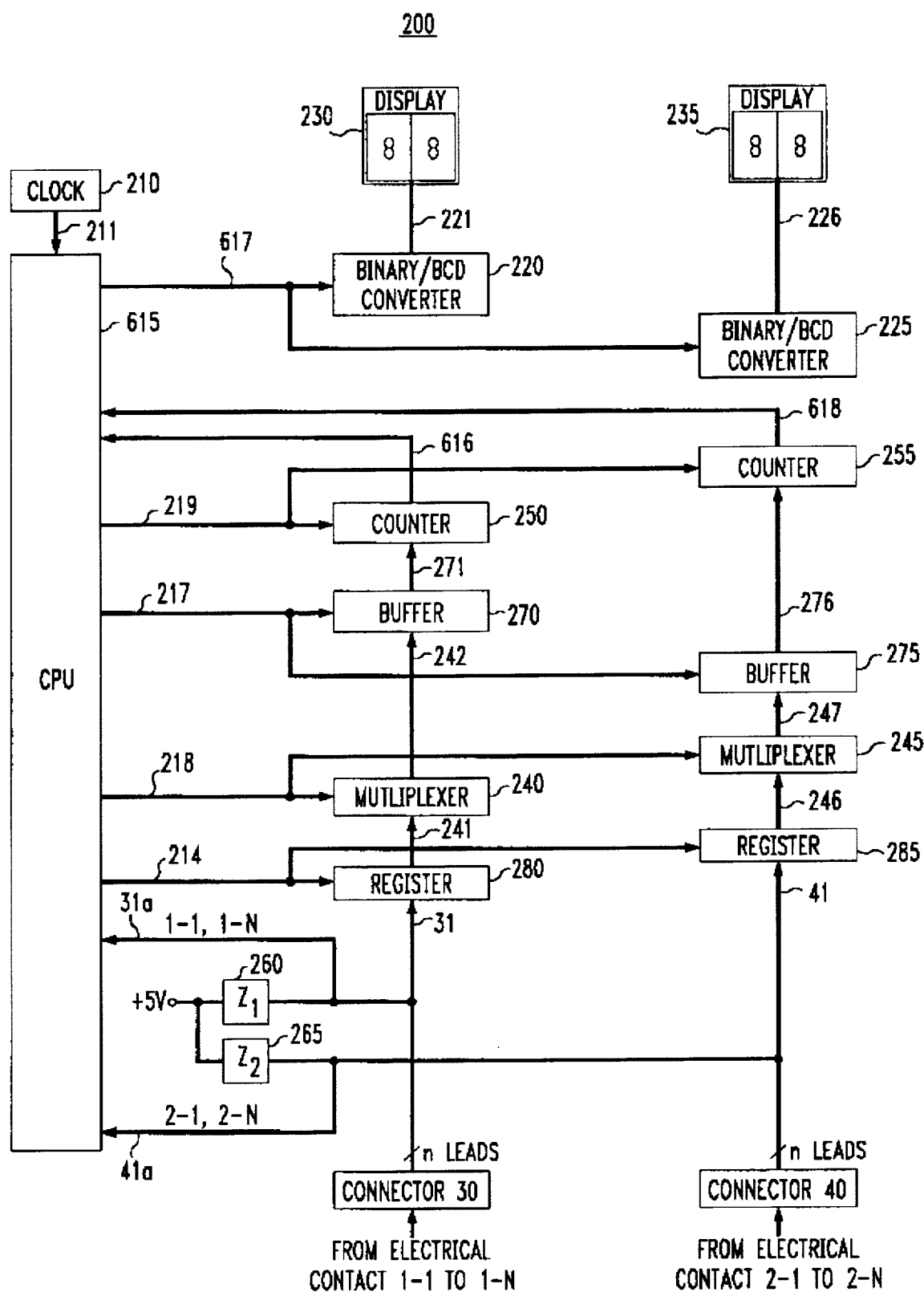
FIG. 9 is a block diagram of another embodiment of measuring electronics 200.

Other ways to measure the contact-area in accordance are also possible as illustrated by FIGS. 8 and 9. In FIG. 8, measuring electronics 200 is replaced by a two-dimensional array of LEDs. In particular, LEDs 3-1 through 3-N are coupled to corresponding electrical contacts 1-1 through 1-N, and to ±5 Volts via resistors 5-1 through 5-N, respectively. Similarly, LEDs 4-1 through 4-N are coupled to corresponding electrical contacts 2-1 through 2-N, and to ±5 Volts via resistors 6-1 through 6-N, respectively. A suitable battery to supply the ±5 Volts is presumed and not shown. The operation of test apparatus 100 is simple. When an electrical contact is grounded by contact with the solder wave, the corresponding LED lights-up. An operator simply has to observe the number of lit LEDs, which corresponds to the contact-area. It is assumed that all components of test apparatus 100 are surface mounted. A higher temperature solder can be used if solder reflow is a problem.

Turning to FIG. 9, another embodiment of measuring electronics 200 is shown. In this example, a microprocessor, along with suitable memory, (CPU 615) replaces control logic 215. In addition, the output signals of counter 250 are provided to CPU 615 via line 616, and CPU 615 provides the data for displays 230 and 235 via line 617 and binary/BCD converters 220 and 225. Illustratively. CPU 615 performs the method shown in FIG. 10. This method is similar to the method shown in FIG. 4 except that within step 353' CPU 615 performs statistically processing of the count information provided by counters 250 and 255, illustratively. The number of holes connected during each sample period (the time between repeated execution of step 320') are averaged to determine the contact-area. The accuracy of the average can be adjusted by increasing or decreasing the sample time.

Figure 10:
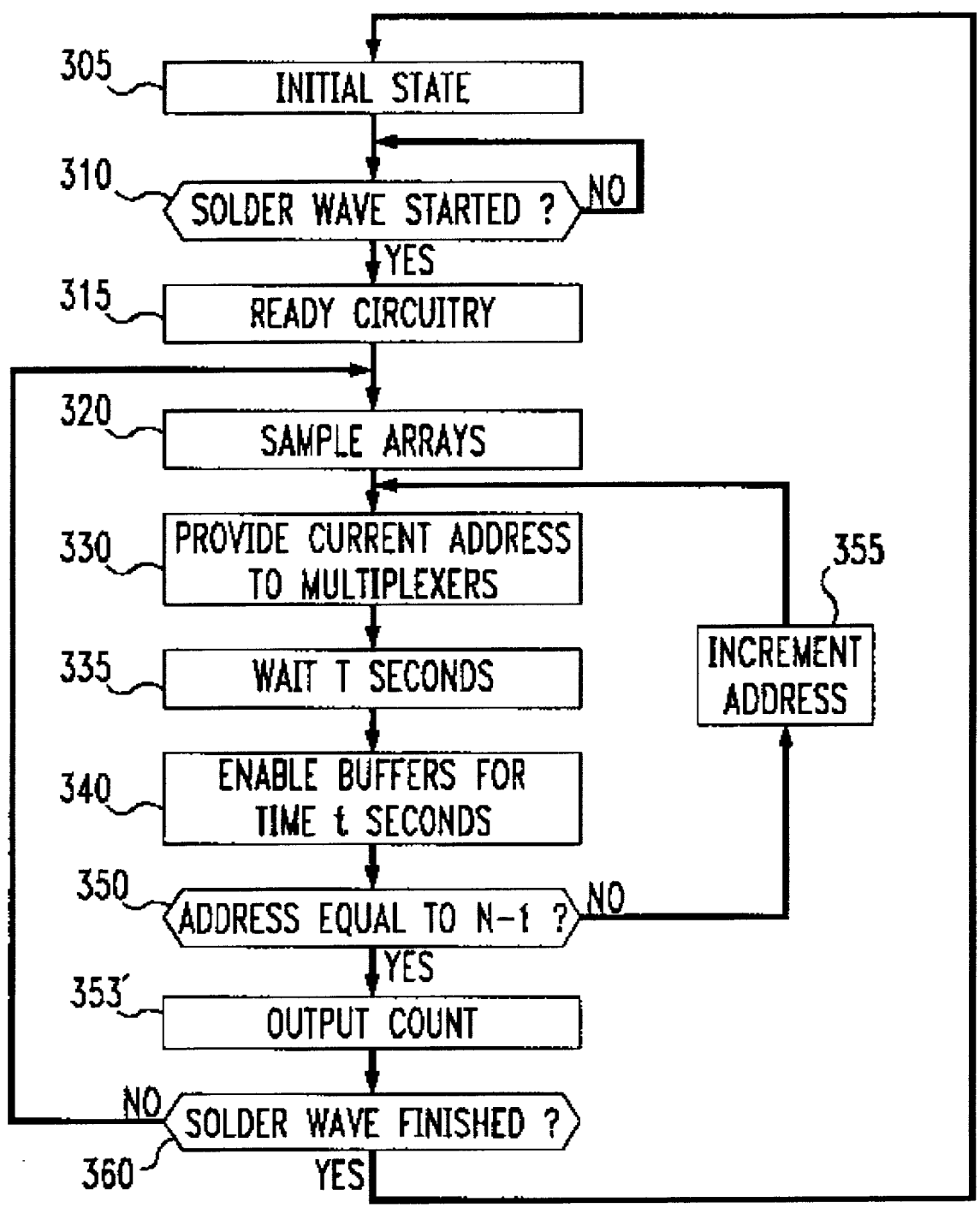
FIG. 10 is a flow diagram of another illustrative method for use in the embodiment of FIG. 9.

It should be noted that, like the measuring electronics of FIG. 3, similar modifications can be made to the method shown in FIG. 10 to accommodate a static method of measuring the contact-area.

As described above, the contact-area of a solder wave is measured by use of a test device that includes a plurality of linear arrays of electrical contacts. We have realized that such a test device provides a basis for real-time adjustment of solder wave height in a solder wave machine. In particular and in accordance with the invention, a wave solder machine includes a means for receiving contact-area information from the test device and a means for adjusting the solder wave in response to the contact-area information.

Figure 11:
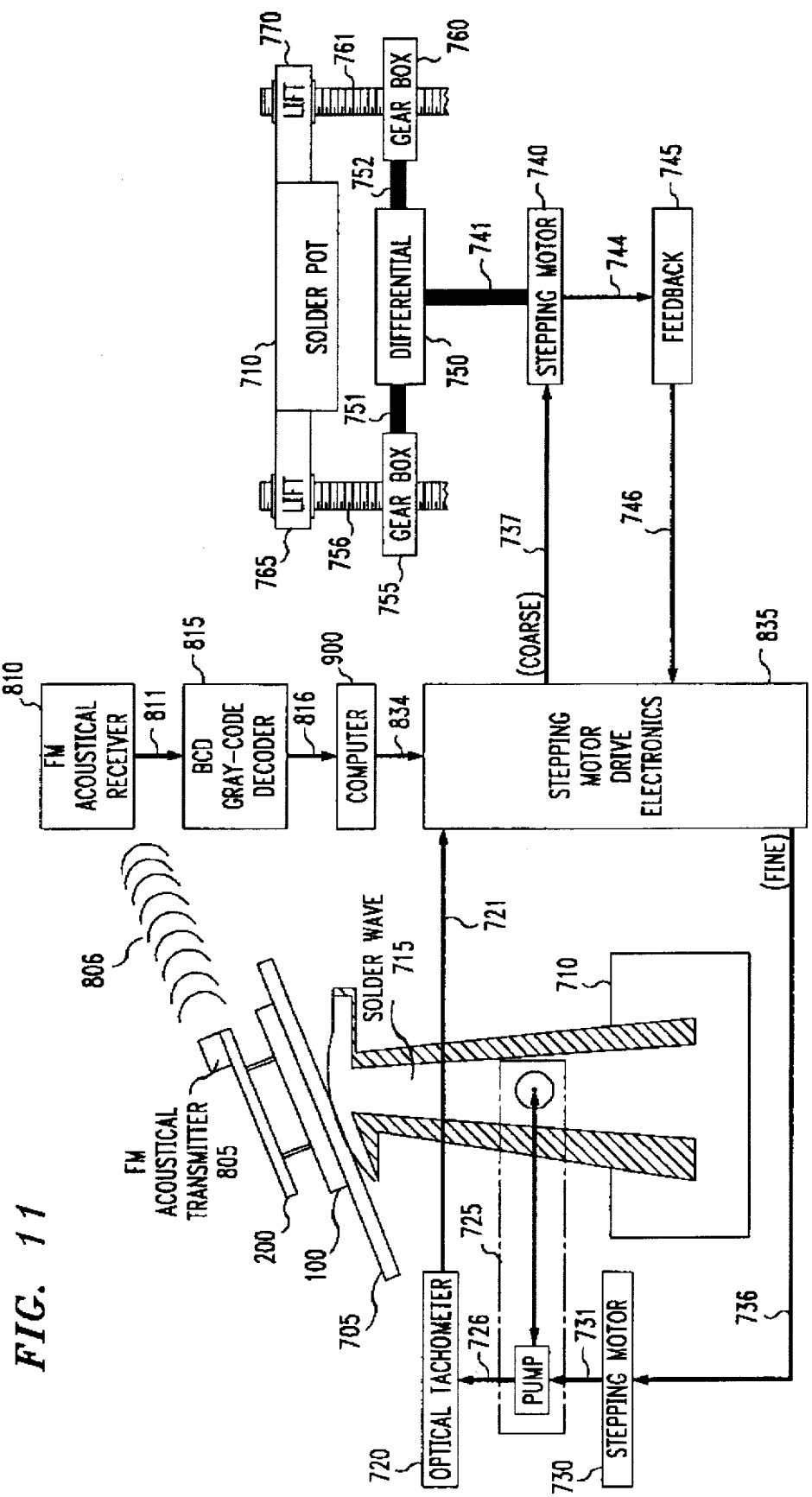
FIG. 11 is a block diagram of a solder wave machine in accordance with the principles of the invention.

An embodiment of the invention is shown in FIG. 11. The elements of the block diagram of FIG. 11 have been numbered to simplify the description of the inventive concept. Other than the inventive concept, the components of FIG. 11 are well-known and will not be described in detail.

Figure 12:
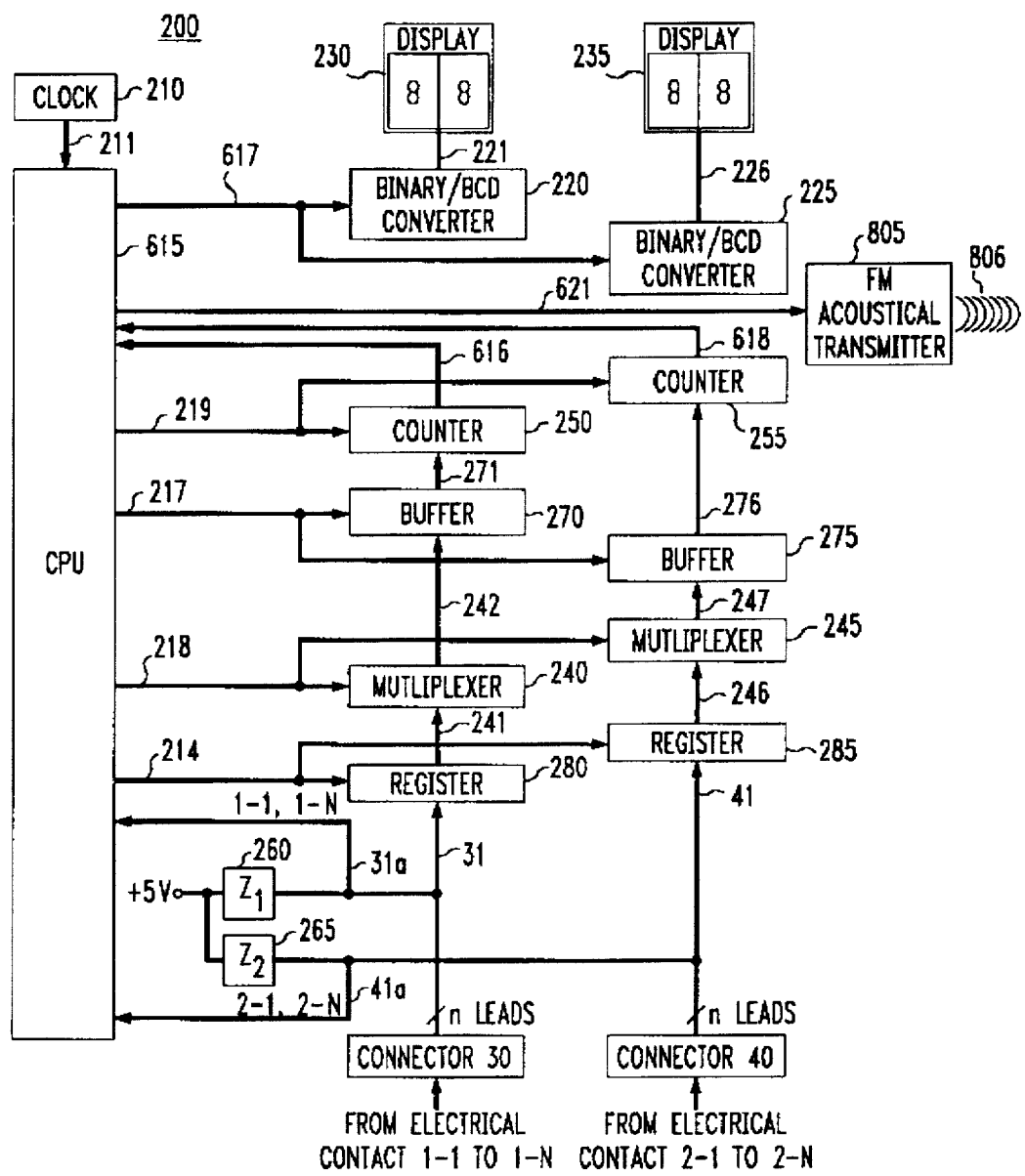
FIG. 12 is a block diagram of another embodiment of measuring electronics 200 for use in the solder wave machine of FIG. 11.

Test device 100 measures the contact-area of the solder wave via measuring electronics 200, as generally described above. A more detailed block diagram of measuring electronics 200 is shown in FIG. 12. The latter is the same as FIG. 9 except for the addition of FM acoustical transmitter (transmitter) 805, which acoustically transmits, via acoustical wave 806, the measured contact-area to FM acoustical receiver (receiver) 810, described below. In this embodiment, CPU 615 not only provides the numbers representing the contact-area to displays 230 and 235, via line 617, but also provides this number to FM acoustical transmitter 805, via line 621. Although CPU 615 could provide the binary number representation of the measured contact-area to transmitter 805 for transmission to receiver 810, it is assumed that CPU 615 first encodes this number using a simple BCD gray-code as known in the art. (In a BCD gray-code, only one signal level changes at a time, which improves noise immunity). Although transmitter 805 and receiver 810 could be optical-based, or radio-frequency (r-f) based, an acoustical type of transmitter and receiver is less susceptible to temperature variations as a result of the soldering process.

Returning to FIG. 11, elements numbered in the seven hundred series, e.g., 705, 710, etc., represent elements of a portion of solder wave machine model number LCG400DR(JK) available from the Sensbey Corporation. The seven hundred series of elements function as in the prior art. In particular, the adjustment of the height of solder wave 715 is accomplished by a) adjusting the height of solder pot 710, and/or b) adjusting the rotation speed of pump 725. Adjustment of the height of solder pot 710 provides a "coarse" level of adjustment by actually moving solder wave 715 closer to, or further from, test device 100. The height of solder pot 710 is adjusted via stepping motor 740, differential 750, gear boxes 755 and 760, and lifts 765 and 770. Feedback element 745 provides a feedback signal as to the current height of solder pot 710. Adjustment of the rotation speed of pump 725 provides a "fine" level of adjustment, e.g., when pump 725 rotates faster, this increases the level of turbulence in solder wave 715, and, as a result, increases the height of solder wave 715. The rotation speed of pump 725 is adjusted via stepping motor 730. Optical Tachometer 720 provides a feedback signal as to the current speed of rotation, e.g., revolutions-per-minute (rpm), of pump 725.

Before proceeding, it should be noted that the Sensbey wave solder machine also uses a computer to control operation of the solder wave machine. However, the embodiment of FIG. 11 is illustrative of applicants inventive concept wherein computer 900 performs functions not found in the computer of the Sensbey wave solder machine. As a result, a seven hundred series number was not used to represent the computer.

As noted earlier, the Sensbey solder wave machine provides for adjustment of the height of a solder wave as a result of a single measuring probe that floats in the solder wave. However, and in accordance with the inventive concept, in this illustrative embodiment this probe has been removed and replaced with test device 100 and adjustment electronics comprising receiver 810, BCD decoder 815, computer 900, and stepping motor drive electronics 835. Receiver 810 demodulates the received acoustical signal and provides a BCD gray-coded signal on line 811 to BCD gray-code decoder 815. The latter provides a binary representation of the measured contact-area to computer 900, which provides an adjustment signal that is a function of the measured contact-area, described further below. The adjustment signal from computer 900 is provided to stepping motor drive electronics 835, via line 834. This adjustment signal comprises a coarse adjustment value and a fine adjustment value. The coarse adjustment value is used by stepping motor drive electronics 835 to adjust the height of solder pot 710, via line 737. The fine adjustment value is used by stepping motor drive electronics 835 to adjust the speed of pump 725, via line 736. Stepping motor drive electronics 835 is, generally speaking, equivalent to the original stepping motor drive electronics (not shown) of the above-mentioned Sensbey wave solder machine except that stepping motor drive electronics 835 provides for 512 adjustment levels (in comparison to only 128 adjustment levels provided by the original stepping motor drive electronics). Stepping motor drive electronics 835 receives feedback signals as known in the art, via lines 721 and 746, for controlling stepping motors 730 and 740, respectively. In particular, line 721 conveys a feedback signal representative of the current rpm of pump 725. This feedback signal is provided by optical tachometer 720. Line 746 conveys a feedback signal representative of the current height of solder pot 710. This feedback signal is provided by feedback element 745.

Figure 13:
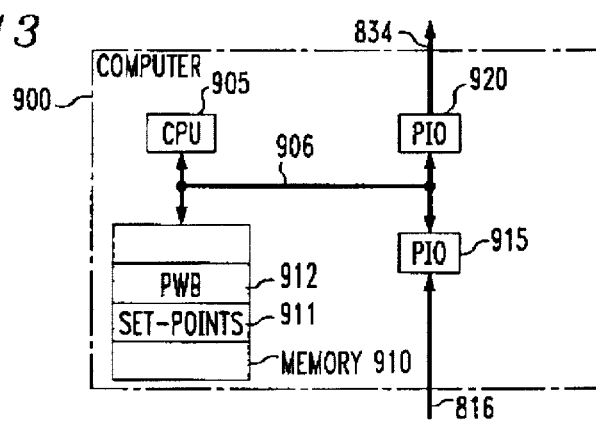
FIG. 13 is a block diagram of an illustrative embodiment of computer 900.
Figure 17:
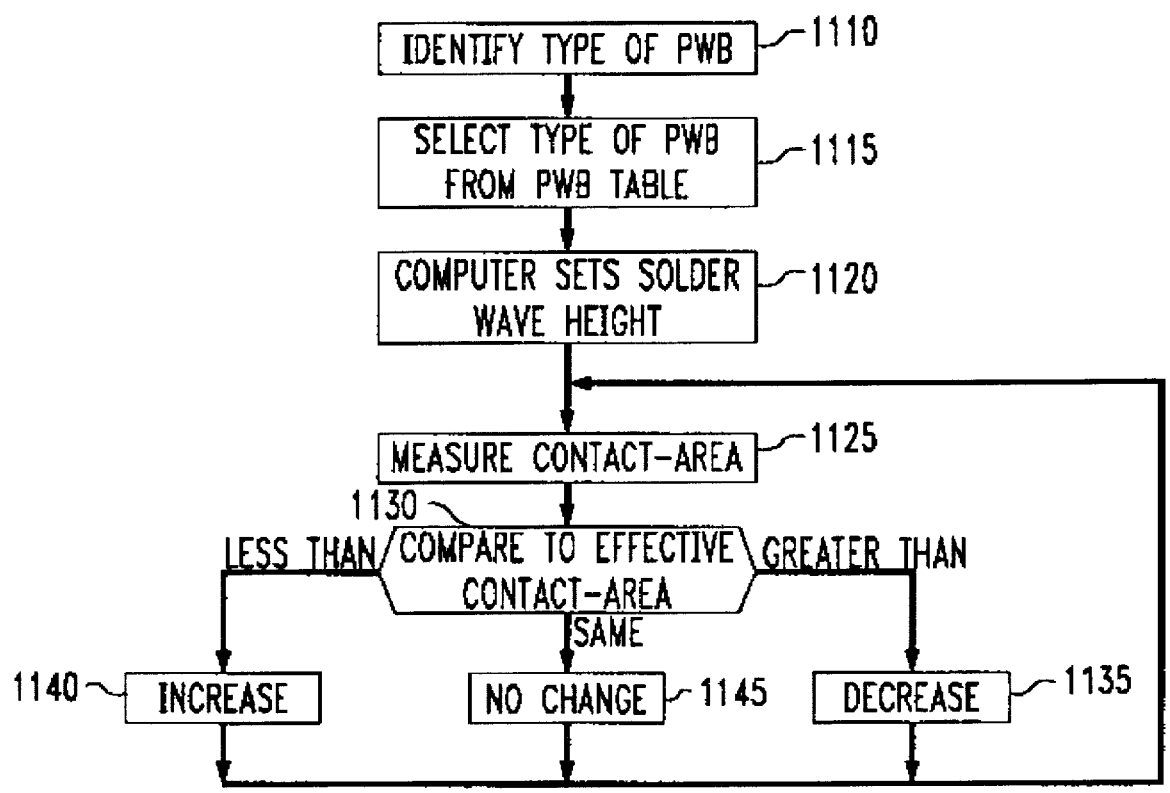
FIG. 17 is a flow diagram of an illustrative method for use in the embodiment of FIG. 11.

Having described in a general fashion the operation of the embodiment of FIG. 11, reference should now be made to FIG. 13, which shows an illustrative block diagram of computer 900. The latter is assumed to be a IBM-compatible personal computer, e.g., an AT&T 386 personal computer. Since IBM-compatible personal computers in this day and age are well-known, only those elements relevant to the inventive concept are shown in FIG. 13 and other elements like the keyboard and display, are not shown. Computer 900 includes CPU 905 and memory 910. CPU 905 is a microprocessor that executes programs from, and operates on data stored, in memory 910. The latter not only represents any volatile form of memory storage, e.g., random-access memory, but also represents non-volatile forms of storage, e.g., a "hard disk" drive. CPU 905 is also coupled to parallel input/output (PIO) interfaces 915 and 912. These PIO interfaces typically "plug in" to computer 900 and provide a parallel interface as known in the art. At this point, in order to facilitate understanding the inventive concept, reference should also be made to FIG. 14, which represents an illustrative method used herein to automatically adjust solder wave height.

Although the inventive concept provides for measurement and automatic adjustment of the solder wave contact-area to an appropriate size, the actual determination of this appropriate size is typically empirically determined. A method for empirically determining the effective contact-area is shown in FIG. 14. In step 950, the solder machine is set to an initial solder height level, $L_o$, via computer 900. This initial solder height level, $L_o$, corresponds to a coarse setting of $C_o$, which represents the height of solder pot 710, and a fine setting of $F_o$, which corresponds to an rpm setting of pump 725. This initial solder height level can be arbitrarily selected, or, again, be based on prior empirical data. In step 955, an initial contact-area, $X_o$-$Y_o$, is measured by running test device 100 through the solder machine. As described above, $X_o$-$Y_o$, represent the number of left and right electrical contacts electrically shorted by the solder wave. This measured contact-area is received in step 960 by computer 900 via transmitter 805, receiver 810, and BCD gray-code decoder 815. The measured contact-area is entered into a "set-point" table in step 965. A illustrative "set-point" table is shown in FIG. 15. Each row of set-point table 940 associates a measured contact-area with a particular coarse and fine setting. Set-point table 940 is stored in memory region 911 of computer 900.

In step 970, a particular type of PWB, e.g., "type A," is then run through the solder machine. A PWB can be characterized into a "type" by such parameters as the thickness of the PWB, number of through-hole components on the PWB, and number of surface mount components on the PWB. Consequently, different types of PWBs are affected differently by the soldering process. In a wave soldering process, the total number of PWBs of a particular type to be wave soldered is typically divided into lots, where each lot includes a smaller number of PWBs. In this example, it is assumed a lot of 10 type "A" PWBs are soldered by the soldering machine in step 970.

In step 975, the number of electrical shorts and electrical opens on these PWBs is measured on an "in-circuit" test assembly (not shown), as known in the art. From this "in-circuit" test data, it is determined if the measured contact-area, from step 955, is an "effective" contact-area. For example, contact-area is proportional to the force of the solder wave against the PWB. As known in the art, this force of the solder wave also causes a capillary action to occur during the solder wave process such that the solder can move up through the holes of the PWB and form solder bridges on the component side of the PWB. As a result, associating the measured contact-area of the solder wave (as determined by test device 100) with the number of electrical shorts found on the test samples of a type of PWB provides a method of empirically determining whether the measured contact-area from step 955 is an effective contact-area for a given type of PWB. For example, if a manufacturing criteria is to have no more than $S_o$ electrical shorts on a PWB, any lot of PWBs that exceed this number, result in not associating the corresponding measured contact-area as an effective contact-area.

In step 980, the in-circuit test data is compared to pre-existing manufacturing standards. If the PWBs in-circuit test data does not meet the pre-existing manufacturing standards, the process returns to step 950 to again change the solder wave height. For example, if too many electrical shorts were detected after the first test run, the solder wave height would be lowered in step 950 from the previous settings of $C_o$, and $F_o$, to new settings of $C_1$, and $F_1$. The contact-area would be measured again in step 955, and this new measured contact area, $X_1$-$Y_1$, is entered into table 940.

On the other hand, if the in-circuit test data meets the pre-existing manufacturing data, an association is made between the type of PWB and the effective contact-area in step 985. For example, FIG. 16 illustrates such an association. For a PWB of type A, an effective contact-area was determined to be $X_1$-$Y_1$, however for a PWB of type B, the effective contact-area was determined to be $X_o$-$Y_o$. It is assumed such a "PWB" table is stored in memory region 912 of computer 900. Entry of this data is performed via a keyboard (not shown) of computer 900.

Before proceeding, it should be noted that the empirical determination of PWB table 945 and set-point table 940 only provide reference points. For example, it is presumed that the "contact-area" is the more important of the data, and the corresponding coarse and fine setting represent a reference point to start at, e.g., for a contact-area of $X_1$-$Y_1$, start with coarse and fine settings of $C_1$ and $F_1$, respectively. The soldering process is affected by any number of variables and a particular coarse and fine setting that resulted in measuring one contact-area may, over time, result in a different measured contact-area.

Once an effective contact-area is determined for each type of PWB, the apparatus of FIG. 11 is used to monitor and automatically adjust the solder height during the soldering process. An illustrative method is shown in FIG. 16. In step 1110, the type of PWB to be manufactured, i.e., soldered is identified, e.g., type "A." In step 1115, an operator (not shown), selects this type from PWB table 945, which associates an effective contact-area, e.g., $X_1$-$Y_1$, with the selected PWB. In step 1120, computer 900 crossindexes the identified effective contact-area into set-point table 940 to determine the initial coarse and fine settings and uses these setting to set the initial solder wave height. Test device 100 is then first passed through the solder machine to measure the contact-area area in step 1125. Computer 900 compares the measured contact-area to the effective contact-area for this type of PWB in step 1130. If the measured contact-area is above the effective contact-area for this type or PWB, computer 900 decreases the height of the solder wave in step 1135. Conversely, if the measured contact-area is below the effective contact-area for this type of PWB, computer 900 increases the height of the solder wave in step 1140. Finally, if the measured contact-area is equal to the effective contact-area, no change is made to the solder wave height in step 1145. The adjustments to solder wave height in steps 1135 and 1140 are presumed to incur in fixed increments, empirically determined. For example, a fine adjustment is performed where the rpms of pump 725 are correspondingly decreased or increased by 5. As known in the art, pump 725 has a predefined rpm operating range. If the fine adjustment results in the rpm setting of pump 725 exceeding the predetermined rpm operating range, a coarse adjustment is made by computer 900 to the height of the solder pot and the rpm setting is set to the middle of the predefined rpm operating range.

The contact-area measurement is run between every lot of PWBs, as reflected by the return to step 1125. Since every lot of PWBs that are soldered are passed through an in-circuit test process, the above-described empirical data of PWB table 945 and set-point table 940 can be continually adjusted.

The foregoing merely illustrates the principles of the invention and it will thus be appreciated that those skilled in the art will be able to devise numerous alternative arrangements which, although not explicitly described herein, embody the principles of the invention and are within its spirit and scope.

For example, although the invention is illustrated herein as being implemented with discrete functional building blocks, e.g., binary counters, multiplexers, etc., the functions of any one or more of those building blocks can be carried out using one or more appropriate programmed processors.

In addition, although the inventive concept was described in the context of two arrays of electrical contacts, it should be realized that any number of arrays can be used to further refine the measurement of the contact-area, i.e., a K-dimensional matrix of electrical contacts can be used where K is greater than one. Finally, it should be realized that the above-described embodiments can include other features like programmability, or user-selectability, of parameters like sample time etc.

What is claimed:

1. A solder wave machine comprising:

means for receiving data representative of a contact-area of a solder wave generated by the solder wave machine; and means responsive to the received data for subsequently adjusting the contact-area of the solder wave.

2. The apparatus of claim 1 wherein the mans responsive subsequently adjusts the contact-area of the solder wave by changing a solder wave height of the solder wave machine as a function of the received data.

3. The apparatus of claim 2 wherein the means responsive subsequently adjusts the contact-area of the solder wave by comparing the received data to a predefined contact-area.

4. The apparatus of claim 1 further including a means for measuring the contact-area to provide the data.

5. The apparatus of claim 4 wherein the means for measuring the contact-area comprises:

a printed circuit board;

a plurality of linear arrays of plated-through holes arranged on the printed circuit board so that each linear array is distributed along a length of the printed circuit board, where the length corresponds to a direction of travel of the solder wave machine; and a measuring means coupled to the plurality of linear arrays for determining the data.

6. The apparatus of claim 4 wherein the means for measuring the contact-area comprises:

a plurality of linear arrays of electrical contacts;

measuring circuitry coupled to the plurality of linear arrays of electrical contacts for determining the data that is representative of the contact-area; and means for providing the data to the means for receiving.

7. The apparatus of claim 6 wherein the measuring circuitry determines the data by counting the number of electrical contacts that are in contact with the solder bath to determine a set of numbers representative of a solder wave contact-area.

8. The apparatus of claim 6 wherein the measuring circuitry determines the data by statistically measuring the solder wave contact-area.

9. The apparatus of claim 6 wherein each linear array includes a plurality of electrical contacts extending in a direction corresponding to a direction of travel of the solder machine.

10. The apparatus of claim 9 where each electrical contact is a plated-through-hole.

11. A method for automatically adjusting a solder wave machine, the method comprising the steps of:

passing a test apparatus over a solder wave generated by the solder wave machine;

using the test apparatus to measure a contact-area of the solder wave to provide a measured contact-area; and subsequently adjusting the contact-area of the solder wave in response to the measured contact-area.

12. The method of claim 10 wherein the test apparatus comprises a plurality of linear arrays, where each array includes a number of electrical contacts, and the step of using includes the step of determining the electrical contacts in each array that are grounded by contact with the solder wave to provide the measured contact-area.

13. The method of claim 12 wherein the step of determining averages the number of electrical contacts in each array that are grounded by contact with the solder wave over a time period, T, to provide the measured contact-area.

14. The method of claim 12 wherein the step of determining counts the number of electrical contacts in each array that are grounded by contact with the solder wave to provide the measured contact-area.

15. The method of claim 11 wherein the step of subsequently adjusting includes the steps of:

comparing the measured contact-area to a reference contact-area;

if the measured contact-area is greater than then the reference contact-area, decreasing the height of the solder wave;

if the measured contact-area is less than the reference contact-area, increasing the height of the solder wave;

whereby the change in the height of the solder wave adjusts the contact-area of the solder wave.

16. The method of claim 15 wherein the height of the solder wave is changed by altering the revolutions-per-minute of a solder pump of the solder wave machine.

17. The method of claim 14 wherein the height of the solder wave is changed by altering a height of a solder pot of the solder wave machine.

* * * * *